United States Patent
Krajewski et al.

(10) Patent No.: US 7,960,643 B2
(45) Date of Patent: *Jun. 14, 2011

(54) ISOLATED METALLIC FLEXIBLE BACK SHEET FOR SOLAR MODULE ENCAPSULATION

(75) Inventors: Todd Krajewski, Mountain View, CA (US); Jason Corneille, San Jose, CA (US); Shefali Jaiswal, Milpitas, CA (US); Anil Vijayendran, San Jose, CA (US)

(73) Assignee: MIASOLE, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/556,460

(22) Filed: Sep. 9, 2009

(65) Prior Publication Data

US 2010/0071757 A1    Mar. 25, 2010

Related U.S. Application Data

(63) Continuation-in-part of application No. 12/464,721, filed on May 12, 2009.

(51) Int. Cl.
*H01L 31/0203* (2006.01)
*H01L 31/048* (2006.01)

(52) U.S. Cl. ........ 136/251; 136/244; 136/252; 136/256; 136/259

(58) Field of Classification Search .......... 136/243, 136/244, 246, 251, 252, 256, 259
See application file for complete search history.

(56) References Cited

U.S. PATENT DOCUMENTS

| | | | |
|---|---|---|---|
| 4,046,951 A | 9/1977 | Stefanik | |
| 4,233,085 A | 11/1980 | Roderick et al. | |
| 4,457,578 A * | 7/1984 | Taylor | 439/801 |
| 4,692,557 A | 9/1987 | Samuelson et al. | |
| 5,008,062 A | 4/1991 | Anderson et al. | |
| 5,597,422 A | 1/1997 | Kataoka et al. | |
| 5,741,370 A | 4/1998 | Hanoka | |
| 6,034,323 A | 3/2000 | Yamada et al. | |
| 6,114,046 A | 9/2000 | Hanoka | |
| 6,128,868 A | 10/2000 | Ohtsuka et al. | |
| 6,660,930 B1 | 12/2003 | Gonsiorawski | |
| 6,953,599 B2 | 10/2005 | Shiotsuka et al. | |

(Continued)

FOREIGN PATENT DOCUMENTS

JP    2002/100788    4/2004

(Continued)

OTHER PUBLICATIONS

Wiles, John, Photovoltaic Power Systems and The 2005 Natiaonal Electrical Code: Suggested Practices, Southwest Technology Development Institute, New Mexico State University, pp. 1-149, 2008.*

(Continued)

*Primary Examiner* — Jennifer K. Michener
*Assistant Examiner* — Jayne Mershon
(74) *Attorney, Agent, or Firm* — Weaver Austin Villeneuve & Sampson LLP

(57) ABSTRACT

Provided are novel back sheets for solar module encapsulation. According to various embodiments, the back sheets are ungrounded and flexible. In certain embodiments, the back sheets include an integrated flexible and electrically isolated moisture barrier. The electrically isolated moisture barrier may be a thin metallic sheet, e.g., an aluminum foil. The electrically isolated, flexible moisture barrier eliminates the need for grounding.

12 Claims, 6 Drawing Sheets

U.S. PATENT DOCUMENTS

| | | | |
|---|---|---|---|
| 6,967,115 | B1 | 11/2005 | Sheats |
| 7,829,783 | B2 | 11/2010 | Krajewski |
| 2002/0129848 | A1 | 9/2002 | Miura et al. |
| 2003/0079772 | A1 | 5/2003 | Gittings et al. |
| 2005/0115603 | A1 | 6/2005 | Yoshida et al. |
| 2005/0257826 | A1 | 11/2005 | Yamanaka et al. |
| 2006/0042681 | A1 | 3/2006 | Korman |
| 2007/0144576 | A1 | 6/2007 | Crabtree et al. |
| 2007/0295388 | A1 | 12/2007 | Adriani et al. |
| 2008/0017241 | A1 | 1/2008 | Anderson et al. |
| 2008/0041442 | A1* | 2/2008 | Hanoka .................. 136/251 |
| 2008/0053512 | A1* | 3/2008 | Kawashima ............. 136/244 |
| 2008/0128018 | A1 | 6/2008 | Hayes |
| 2008/0185035 | A1 | 8/2008 | Hayes |
| 2008/0190481 | A1 | 8/2008 | Hayes et al. |
| 2008/0196760 | A1 | 8/2008 | Hayes et al. |
| 2008/0210287 | A1 | 9/2008 | Volpp et al. |
| 2008/0264471 | A1 | 10/2008 | Hayes |
| 2008/0289681 | A1* | 11/2008 | Adriani et al. .......... 136/251 |
| 2008/0289682 | A1 | 11/2008 | Adriani et al. |
| 2008/0302418 | A1 | 12/2008 | Buller et al. |
| 2009/0114261 | A1* | 5/2009 | Stancel et al. .......... 136/244 |
| 2009/0173384 | A1 | 7/2009 | Ooi et al. |

FOREIGN PATENT DOCUMENTS

| | | |
|---|---|---|
| JP | 2007/035694 | 2/2007 |
| JP | 2008/098592 | 4/2008 |
| JP | 2008/147530 | 6/2008 |
| WO | 9206144 A1 | 4/1992 |
| WO | 2006106844 A1 | 10/2006 |
| WO | 2008136872 A1 | 11/2008 |

OTHER PUBLICATIONS

MIL-STD-275E, Military Standard, Printed Wiring For Electronic Equipment, 1984.*

MIL-S-83576, Military Specification, Solar Cell Arrays, Space Vehicle, Design and Testing, General Specification for, 1974.*

Nowlan, M. J., "Hermetic Edge Sealing of Photovoltaic Modules", National Aeronautics and Space Administration, Washington D.C., Report: NAS 1.26.173125; DOE/JPL-956352/2, Jul. 1983, Abstract, 1 page.

National Aeronautics and Space Administration, "Hermetic Edge Seals for Photovoltaic Modules: Corrosive Atmosphere Agents are Excluded to Prolong Cell Life", Washington D.C., Aug. 1986, Abstract, 1 page.

Nowland, M.J., et al, "Process Automation for Photovoltaic Module Assembly and Testing", Photovoltaic Specialists Conference, 2000, Conference Record of the Twenty-Eight IEEE, Sep. 15-22, 2000, Abstract, 1 page.

Hanoka, J. I., et al., "Low Cost Module and Mounting Systems Developed Through Evergreen Solar's PVMaT Program", Photovoltaic Specialists Conference, 1997, Conference Record of Twenty-Sixth IEEE, Sep. 29-Oct. 3, 1997, Abstract, 1 page.

U.S. Appl. No. 12/464,721, "Isolated Metallic Flexible Back Sheet for Solar Module Encapsulation", Krajewski et al., filed May 12, 2009.

US Office Action for U.S. Appl. No. 12/464,721, mailed May 28, 2010.

U.S. Appl. No. 12/639,346, "Oriented Reinforcement for Frameless Solar Modules", Krajewski, filed Dec. 16, 2009.

Day, B.P.F., Campden and Chorleywood Food Research Association, "Chilled Food Packaging" in Chilled Foods: A Comprehensive Guide, $2^{nd}$ Edition, pp. 135-150.

Nowlan, M. J., "Hermetic Edge Sealing of Photovoltaic Modules", National Aeronautics and Space Administration, Washington D.C., Report: NAS 1.26.173125; DOE/JPL-956352/2, Jul. 1983, 29 pages.

National Aeronautics and Space Administration, "Hermetic Edge Seals for Photovoltaic Modules: Corrosive Atmosphere Agents are Excluded to Prolong Cell Life", Washington D.C., Aug. 1986, 1 page.

Nowland, M.J., et al, "Process Automation for Photovoltaic Module Assembly and Testing", Photovoltaic Specialists Conference, 2000, Conference Record of the Twenty-Eight IEEE, Sep. 15-22, 2000, 4 pages.

Hanoka, J. I., et al., "Low Cost Module and Mounting Systems Developed Through Evergreen Solar's PVMaT Program", Photovoltaic Specialists Conference, 1997, Conference Record of Twenty-Sixth IEEE, Sep. 29-Oct. 3, 1997, 4 pages.

International Search Report and Written Opinion mailed Dec. 20, 2010, for Application No. PCT/US2010/034386.

U.S. Appl. No. 12/539,054, "CTE Modulated Encapsulants for Solar Modules", Hardikar et al., filed Aug. 11, 2009.

U.S. Appl. No. 12/820,408, "Photovoltaic Module Electrical Connectors", Shufflebotham et al., filed Jun. 22, 2010.

U.S. Appl. No. 12/838,365, "Composite Encapsulants Containing Fillers for Photovoltaic Modules", Nelson et al., filed Jul. 16, 2010.

U.S. Appl. No. 12/820,415, "Flexible Photovoltaic Modules in a Continuous Roll", Shufflebotham et al., filed Jun. 22, 2010.

* cited by examiner

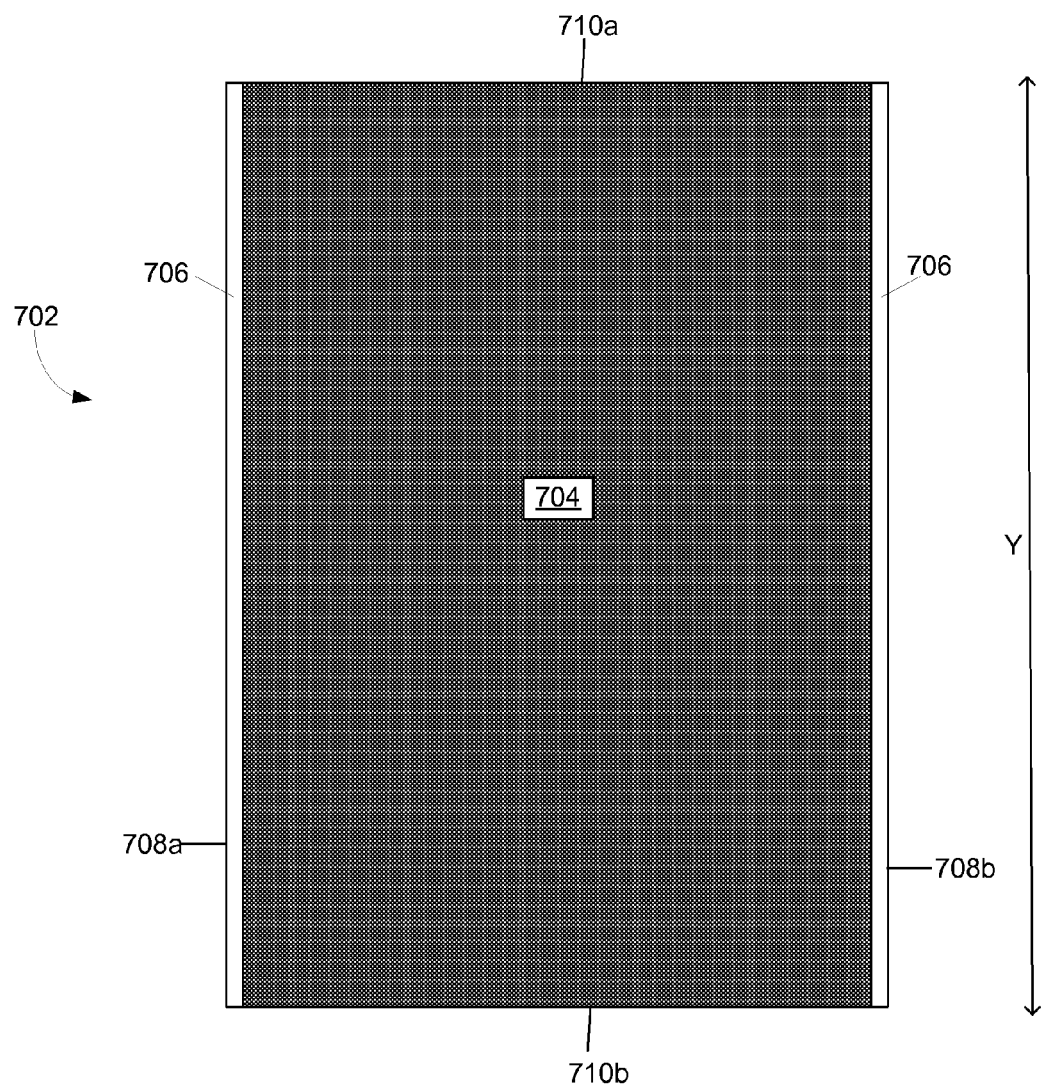
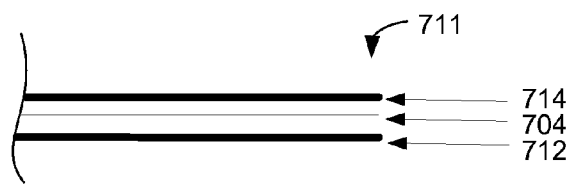
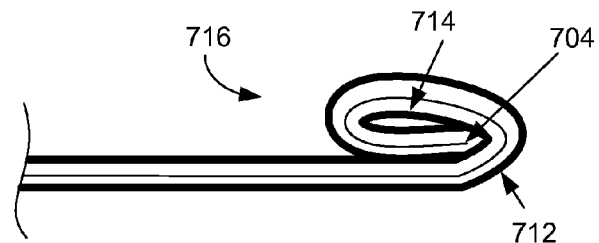
FIG. 7

ISOLATED METALLIC FLEXIBLE BACK SHEET FOR SOLAR MODULE ENCAPSULATION

CROSS-REFERENCE TO RELATED APPLICATION

This application is a continuation-in-part of and claims priority under 35 USC §120 to U.S. patent application Ser. No. 12/464,721, filed May 12, 2009, which is incorporated by reference herein in its entirety.

BACKGROUND OF THE INVENTION

Photovoltaic cells are widely used for generation of electricity, with multiple photovoltaic cells interconnected in module assemblies. Such modules may in turn be arranged in arrays and integrated into building structures or otherwise assembled to convert solar energy into electricity by the photovoltaic effect. Individual modules are encapsulated to protect the module components from the environment. A module may be framed, with the frame configured for attachment to a support surface. Framing and encapsulating materials can contribute significantly to the weight and cost of a module.

SUMMARY OF THE INVENTION

Provided are novel back sheets for solar module encapsulation. According to various embodiments, the back sheets are ungrounded and flexible. In certain embodiments, the back sheets include an integrated flexible and electrically isolated moisture barrier. The electrically isolated moisture barrier may be a thin metallic sheet, e.g., an aluminum foil. The electrically isolated, flexible moisture barrier eliminates the need for grounding.

One aspect of the invention relates to solar modules that include a transparent front layer, a multi-layer flexible back sheet; and a plurality of interconnected photovoltaic cells disposed between the transparent front layer and the multi-layer flexible back sheet. The multi-layer flexible back sheet includes an insulation sheet, an electrically isolated moisture barrier, and a back layer; with the insulation sheet disposed between the plurality of photovoltaic cells and the moisture barrier and the moisture barrier disposed between the insulation sheet and the back layer. The back layer has dimensions greater than the moisture barrier and extends past the moisture barrier to enclose an edge of the moisture barrier.

In certain embodiments, the back layer also extends past the insulation sheet to enclose an edge of the insulation sheet. The back layer may enclose the entire perimeter edge of the moisture barrier and/or insulation sheet or a portion of the perimeter edge. All or part of a perimeter portion of the back layer may be sealed to another module component. In certain embodiments, an edge seal material surrounding the plurality of photovoltaic cells is sealed to the back layer. In certain embodiments, the insulation sheet and back layer are arranged to fully enclose the moisture barrier.

Another aspect of the invention relates to solar modules that include a transparent front layer; a multi-layer flexible back sheet; and a plurality of interconnected photovoltaic cells disposed between the transparent front layer and the multi-layer flexible back sheet. The multi-layer flexible back sheet includes an insulation sheet, an electrically isolated moisture barrier, a back layer and a seal; with the insulation sheet disposed between the plurality of photovoltaic cells and the moisture barrier, the moisture barrier disposed between the insulation sheet and the back layer, and the seal including the perimeter of the back layer and/or a bond to the perimeter of the back layer.

In certain embodiments, the seal includes a bond between the perimeter of the back layer and a second module component. The second module component may be an edge seal material that surrounds the photovoltaic cells, or may be another component. In certain embodiments, the back layer has dimensions greater than the moisture barrier and extends past the moisture barrier to cover the perimeter of the moisture barrier.

According to various embodiments, the transparent front layer may be a rigid material, e.g., a glass plate, or it may be flexible material. The photovoltaic cells may be any type of photovoltaic cells, including but not limited to CIS, CIGS, CdTe or silicon photovoltaic cells.

According to various embodiments, the moisture barrier is a pinhole free conductive material, e.g., pinhole free aluminum foil. The moisture barrier is typically thin, e.g., no more than about 50 microns thick, or no more than 25 microns thick. Other thicknesses may be used as appropriate to provide a flexible moisture barrier.

According to various embodiments, the insulation sheet is a dielectric material capable of withstanding at least a certain potential, e.g., a 600 V potential or 1000 V potential. In certain embodiments, a PET insulation sheet having a thickness of about 1-10 mils is used. The insulation sheet may be a single sheet or a multi-layer sheet, e.g., with different layers having different material properties or compositions.

The back layer may be a weatherable material capable of protecting the module from external conditions, for example polyvinyl fluoride or other fluoropolymers. In alternative embodiments, the back layer may be another material, and the module may include a weatherable material under the back layer. The back layer may be a single layer or may have multiple layers, e.g., with different layers having different material properties or compositions. If present, the bond between the back layer and another module component may be an adhesive bond, or any other type of bond sufficient to electrically isolate the moisture barrier.

Also provided are flexible multi-layer back sheets and methods of fabricating the same, as well as pre- and post-laminate back sheet and solar module stack assemblies. These and other aspects of the invention are described further below with reference to the figures.

BRIEF DESCRIPTION OF THE DRAWINGS

FIG. 7 depicts various views of a cut laminate stack including a moisture barrier and overlying and underlying polymer layers according to certain embodiments.

DETAILED DESCRIPTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. In the following description, numerous specific details are set forth in order to provide a thorough understanding of the present invention. The present invention may be practiced without some or all of these specific details. In other instances, well known mechanical apparatuses and/or process operations have not been described in detail in order not to unnecessarily obscure the present invention.

Figure 1:
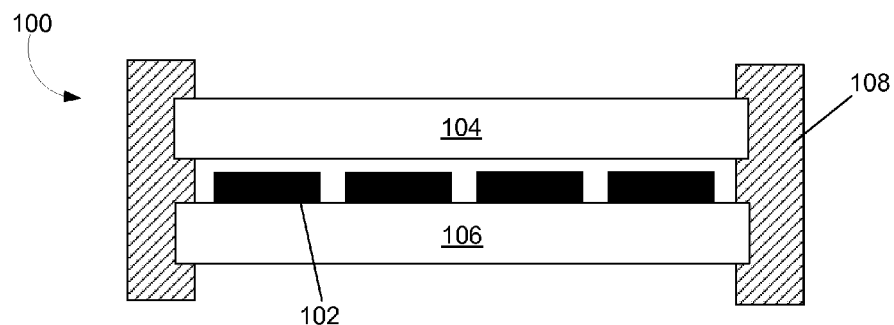
FIG. 1 is a cross-sectional view of certain components of a solar module.

Embodiments of the present invention relate to encapsulating solar modules for environmental protection and mechanical support. FIG. 1 shows a not-to-scale cross-sectional view of certain components of a solar module 100, including interconnected solar cells 102 and front and back encapsulating layers 104 and 106, respectively. Front and back encapsulating layers 104 and 106 protect interconnected solar cells 102 and other module components from environmental conditions. In certain modules, a frame 108 surrounds the rest of the module for mechanical support.

Front and back encapsulating layers 104 and 106 can contribute significantly to the weight and transportation costs of a module. Rigid materials such as glass sheets, for example, provide good protection against environmental conditions but can add on the order of $2/sheet in transportation costs. While flexible materials such as aluminum foil are lighter and cheaper than glass, they present their own costs and issues. In particular, conventional metalized back sheets require grounding the metal in the back sheet or a grounded metal frame surrounding the module to prevent electrical shorting. Grounding a module, e.g., via a conductive frame also presents a major cost: the frame, conductors to ground, and installation costs of a grounded module are significant and present barriers to the competitive pricing of solar energy generation.

Provided herein are flexible encapsulating materials that do not require grounding or framing. The materials are considerably lighter and easier to handle than rigid encapsulation materials, and do not require the attendant issues of grounding and framing that conventional metalized encapsulation layers do. In certain embodiments, a flexible metallic back sheet is provided. Unlike current metalized back sheets for moisture impermeable solar module encapsulation, the metalized back sheets described herein do not require grounding to meet UL standards, and may be ungrounded in certain embodiments. Section 690.43 of the 2005 National Electrical Code (NEC) requires that: "Exposed non-current-carrying metal parts of module frames, equipment, and conductor enclosures shall be grounded in accordance with 250.134 or 250.136(A) regardless of voltage." Because embodiments of the invention do not have exposed moisture barriers, or in certain embodiments, any exposed metal parts, they do not require grounding to be in compliance with the 2005 version of the US NEC. In particular embodiments, the solar modules or back sheets described herein meet the wet leakage current and/or high potential standards as defined in UL 1703. Article 690 of the 2005 NEC and UL 1703, edition 3, as revised April 2008, are incorporated by reference herein.

Figure 2:
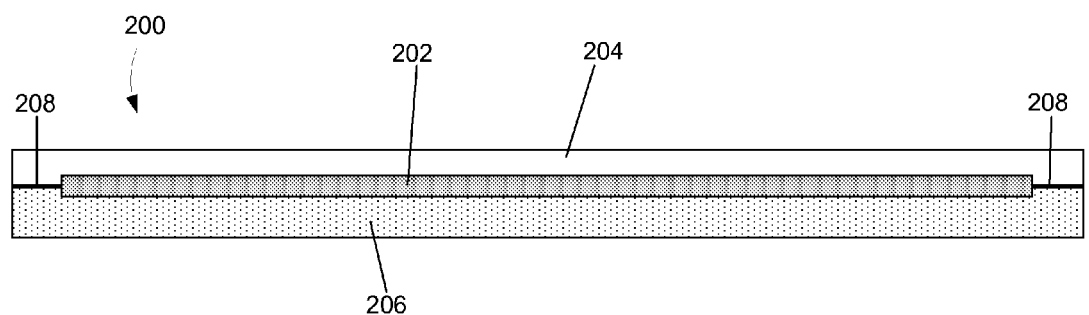
FIG. 2 is a cross-sectional view of a flexible back sheet according to certain embodiments.

FIG. 2 is a not-to-scale cross-sectional view of a flexible back sheet 200 according to certain embodiments. Back sheet 200 includes a flexible moisture barrier 202 sandwiched between an insulation sheet 204 and a back layer 206. A seal 208 extends around the moisture barrier. Insulation sheet 204, back layer 206 and seal 208 together electrically isolate the moisture barrier 202 to prevent shorting between the solar cells in the assembled module and the moisture barrier 202. As is described further below with respect to FIG. 4, in certain embodiments, the back layer extends towards the front layer to cover the edges of the moisture barrier. In these embodiments, the back layer may also cover the edges of the insulation sheet.

Moisture barrier 202 may be any material that is flexible and moisture impermeable. Moisture impermeability may be defined by the water vapor transmission rate (WVTR), the steady state rate at which water vapor permeates through a film at specified conditions of temperature and relative humidity. According to various embodiments, the moisture barrier has a WVTR of no more than $10^{-2}$ g/m$^2$/day at 38° C. and 100% relative humidity. In certain embodiments, the moisture barrier has a WVTR of no more than $10^{-3}$ g/m$^2$/day at 38° C. and 100% relative humidity.

The moisture barrier may be a pinhole-free metallic material, including, but not limited to pinhole-free aluminum foil. In addition to aluminum or alloys thereof, metallic moisture barriers may be copper, palladium, titanium, gold, silver, iron, molybdenum, stainless steel, steel, zinc, alloys thereof such as brass, or other combinations thereof. In certain embodiments, the moisture barrier may be a metallic or other conductive material in combination with another material. The moisture barrier should be thick enough to be pinhole-free, or to meet the desired WVTR. This varies according to the particular metal used. In one example, aluminum foil as thin as about 17 microns is used. In another example, pinhole-free aluminum foil as thin as about 25 microns, or about 50 microns is used. In certain embodiments, moisture barriers between about 5 and 500 microns may be used, though other thicknesses may be used as well.

In certain embodiments, insulation sheet 204 is sufficient to withstand a high electrical potential between a conductive moisture barrier 202 and the solar cells (not shown) to prevent arcing or shorting. The voltage withstand of the sheet is a function of the material properties of the insulation sheet material as well as the thickness of the sheet. In certain examples, thickness ranges from about 1 to 10 mils or higher, though other thicknesses may be used as appropriate. According to various embodiments, the voltage withstand of the insulation sheet is at least about 500 V, at least about 600 V, at least about 700 V, at least about 800 V, at least about 900 V, at least about 1000 V, at least about 1500 V, or at least about 2000 V. In certain embodiments, the insulation material is or contains a thermoplastic material. Non-limiting examples of insulation materials include thermal polymer olefins (TPO) and non-olefin thermoplastic polymers, including polyethylene, polypropylene, polybutylene, polyethylene terephthalate (PET), polybutylene terephthalate (PBT), polystyrene, polycarbonates, ethylene-vinyl acetate (EVA), fluoropolymers, acrylics, including poly(methyl methacrylate), or silicones, as well as multilayer laminates and co-extrusions, such as PET/EVA laminates or co-extrusions. In one example, the insulation sheet is PET. In other examples, the insulation sheet is a nylon, acylonitrile butadiene styrene ABS), polybutylene terephtalate (PBT), (polycarbonate (PC), PPS (polyphenylene sulfide (PPS), or polyphenylene oxide (PPO). Other suitable electrically insulating materials may be used, e.g., thin ceramic materials. Filled materials may also be used.

Back layer 206 may be a weatherable material that protects the cells and other module components from moisture, UV exposure, extreme temperatures, etc. The back layer may be a fluoropolymer, including but not limited to polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethane (PCTFE). Other weatherable materials may be used in addition to or instead of a fluoropolymer, including silicone polyesters, chlorine-containing materials such as polyvinyl chloride (PVC), plastisols and acrylics. In certain embodiments, any material that meets UL 1703 requirements (incorporated by reference above) is used. In one example, the back layer is PVF. In certain examples, thickness range from about 1 to about 4 mils, although other thicknesses may be used as appropriate.

Seal 208 includes a bond between back layer 206 and insulation sheet 204 and is effective to prevent any electrical contact between the moisture barrier and the solar cells or any other component of the module at the edge of moisture barrier 202. It is typically a permanent or irreversible seal and prevents peeling at the edges that would expose the edge of moisture barrier 202. According to various embodiments, the seal is at least 0.5 mm, 1 mm or 2 mm wide and extends around the edge of the moisture barrier. The bond between back layer 206 and insulation sheet 204 may be an adhesive bonding, a fusion bonding, a welding, a solder bond, or a mechanical fastening. As used herein, the term "permanent seal" refers to a seal that has a resistance to rupture greater than a frangible seal. As used herein, "irreversible seal" refers to seal that is unbreakable by exposure to atmospheric heat and weather conditions, and generally must be deliberately tampered with to be broken. In certain embodiments, the seal includes covalent bonding, e.g., between an adhesive and the back layer and/or insulation sheet, or between the insulation sheet and back layer, etc.

If an adhesive material is used, it may be a thermoplastic adhesive, a liquid adhesive, a curable adhesive, or any other type of adhesive that creates an irreversible seal, is resistant to peeling and has good moisture resistance. Thermoplastic adhesives that may be used include acrylics, silicone resins, polyamines and polyurethanes. In certain embodiments, the adhesive may also be used to adhere the insulation sheet and back layer to the moisture barrier. In certain embodiments, one of the layers may be formed by extrusion coating or casting, e.g., on a chemically primed surface. For example, moisture barrier 202 may be adhered to insulation sheet 204. Insulation sheet 204 or (insulation sheet 204 and moisture barrier 202) may then be chemically primed and back layer 206 formed by extrusion coating or casting onto the chemically primed surface.

Figure 3:
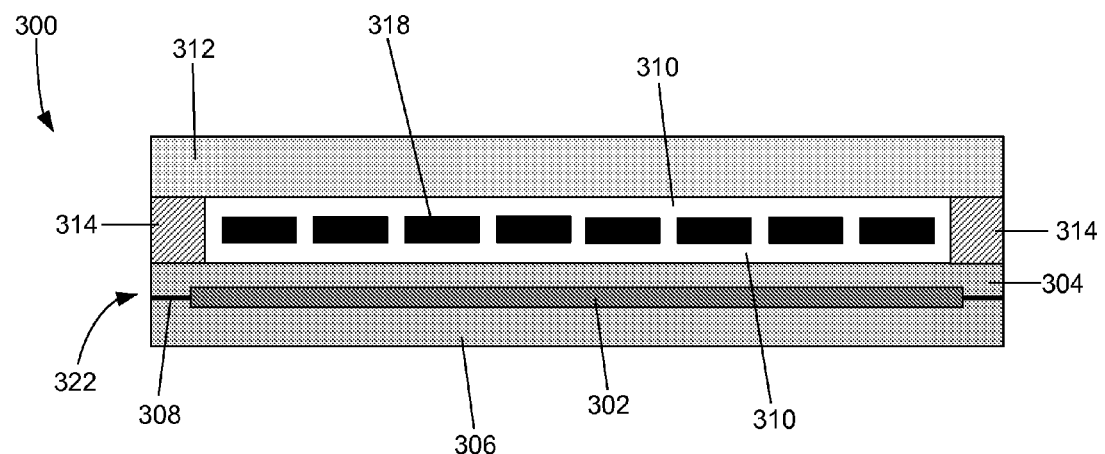
FIGS. 3 and 4 are cross-sectional views a solar module having a metalized back sheets according to various embodiments.

FIG. 3 shows an example of solar module 300 having a metalized back sheet 322 as described above with reference to FIG. 2. For the purposes of illustration, the schematic is not drawn to scale. Solar cells 318 may be any type of solar cells, including but not limited to, semiconductor-based solar cells including microcrystalline or amorphous silicon, cadmium telluride, copper indium gallium selenide or copper indium selenide, dye-sensitized solar cells, and organic polymer solar cells.

Solar cells 318 are encapsulated by a material 310 that protects the solar cells and that may include one or more layers of a thermoplastic material, e.g., an acrylic or silicone material. A material 314 surrounds solar cells 318. The material 314 may be an organic or inorganic material that has a low inherent WVTR (typically less than 1-2 $g/m^2/day$) and, in certain embodiments may absorb moisture, prevents its incursion through and along edges of material 310. In one example, a butyl-rubber containing moisture getter or desiccant is used. The encapsulated cells 318 are protected by a transparent front layer 312 and back sheet 322, including weatherable back layer 306, insulation sheet 304, moisture barrier 302 and seal 308.

In the figure, moisture barrier material 302 is disposed under solar cells 318, but extends at least a small distance past solar cells 318, such that it partially underlies material 314. In certain embodiments, the outer perimeter of the moisture barrier 302 is located between the inner and outer perimeters of the material 314.

Figure 4:
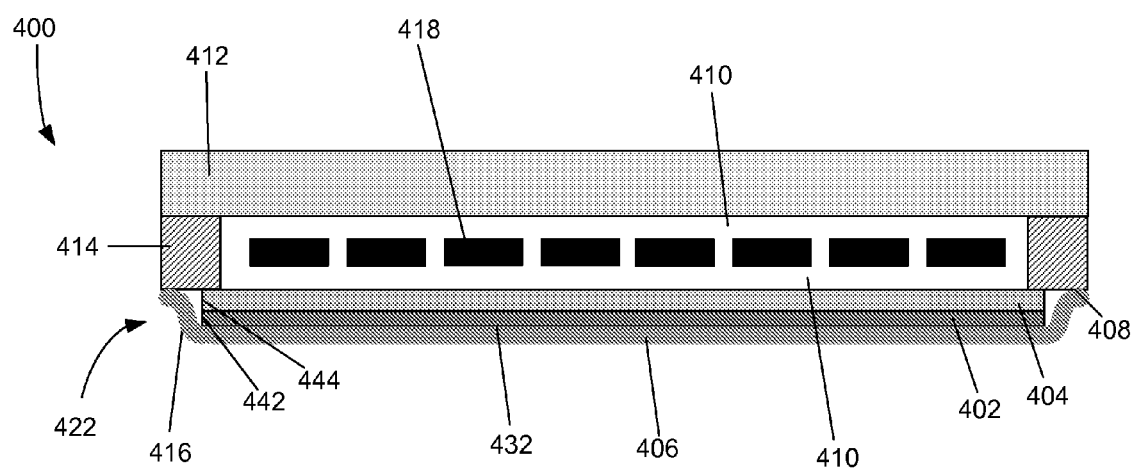

FIG. 4 depicts a photovoltaic module 400 including a multi-layer back sheet 422 according to another embodiment. For the purposes of illustration, the schematic is not drawn to scale. As described above, solar cells 418 are encapsulated by a material 410. A material 414 surrounds the solar cells to provide an edge seal. The encapsulated cells 418 are protected by a transparent front layer 412 and multi-layer back sheet 422. Multi-layer back sheet 422 includes moisture barrier 402 disposed between insulation sheet 404 and back layer 406. Back layer 406 has planar dimensions larger than those of the moisture barrier 402 and insulation sheet 404. The perimeter portion 416 of back layer 406 extends toward front layer 412 so that back layer 406 covers the perimeter edge 442 of moisture barrier 402 as well as surface 432 of moisture barrier 402. In the figure, the perimeter portion 416 of back layer 406 covers the perimeter edge 444 of insulation sheet 404 as well. The back layer 406 may or may not physically contact each of the edges 442 and 444 of the moisture barrier and insulation sheet, respectively.

In this example, perimeter portion 416 of back layer 406 is bonded to edge material 414 to form a seal at 408. Depending on the particular arrangement of the module components, the perimeter portion 416 of back layer 406 may be sealed to any suitable materials or layers that are disposed on the opposite side of moisture barrier 402 as the main portion of back layer 406. For example, the back layer may form a seal with an insulation sheet, an encapsulant material such as material 410, a transparent front layer 412, or any other suitable module component, or combination of these. According to various embodiments, the seal is at least 0.5 mm, 1 mm or 2 mm wide. It may extend around the module to fully isolate the moisture barrier.

Prior to being folded or bent toward the photovoltaic cells, the back layer 406 may have dimensions slightly larger than the front layer 412, i.e., to account for the perimeter portion 416 that is bent toward the edge material. According to various embodiments, the back layer extends up to 10 mm past each edge of the moisture barrier and/or insulation sheet. In certain embodiments, the insulation sheet and moisture barrier are about equally sized. In other embodiments, the insulation sheet may be larger than the moisture barrier.

As indicated above, in certain embodiments, the module includes a permanent and/or irreversible seal that includes bonding between the back layer and the edge material or other module component to which the back layer is sealed. This may be an adhesive bonding, a fusion bonding, a welding, a solder bond, or a mechanical fastening. In certain embodiments, the seal includes covalent bonding, e.g., between an adhesive and the back layer and/or edge material, or between the back layer and edge material, etc. Moisture barrier 402 is electrically isolated by insulation sheet 404 and sealed back layer 406.

Figure 5:
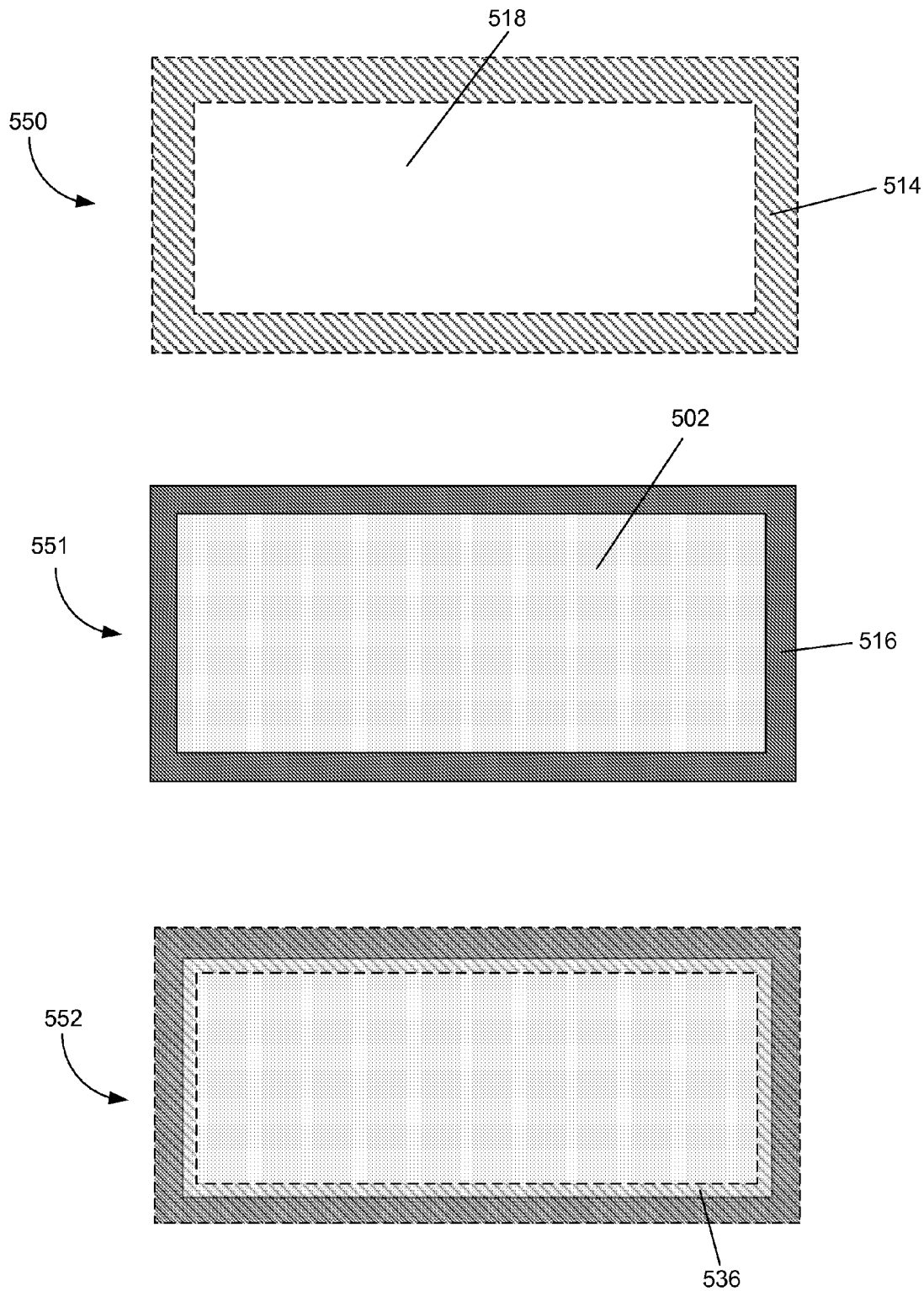
FIG. 5 depicts 1) a plan view according to certain embodiments of a solar cell area of a solar module and moisture getter/desiccant material surrounding the solar cell area, 2) a plan view according to certain embodiments of a metallic moisture barrier of a solar module and a back layer surrounding the metallic moisture barrier, and 3) a plan view of a solar cell area and surrounding moisture getter overlying a metallic moisture barrier and back layer, also according to certain embodiments.

In certain embodiments, the moisture barrier overlaps with an edge seal material surrounding the solar cells in a plane vertical to the module. FIG. 5 shows a plan view 550 of solar cell area 518 and material 514 surrounding solar cell area 518 according to certain embodiments. Also shown is a view 551 of a metallic moisture barrier 502 overlying a back layer, the perimeter portion 516 of which is shown. (For the purpose of illustration, other layers, such as an insulation sheet and encapsulation material, etc. are not depicted.)

Plan view 552 shows the solar cell area 518 and surrounding material 514 (as depicted in view 550) overlying the metallic moisture barrier 502 and the back layer including the perimeter portion 516 (as depicted in view 551). Material 514 and metallic moisture barrier 502 overlap in region 536. This provides moisture protection over the entire solar cell area 518. All or a portion of the back layer that extends past the moisture barrier (perimeter area 516) may contact and/or be sealed to all or a portion of another module component, e.g., to an insulation sheet (as depicted in FIG. 3), edge material 514 (as depicted in FIG. 4), or other appropriate layer or material. In certain embodiments, the perimeter portion of the back layer may contact or be sealed to multiple other layers or materials in the module.

Conventional back sheets that incorporate a metallic sheet, such as Tedlar®/Al foil/PET back sheets, require grounding the aluminum foil in the back sheet or a grounded metal frame surrounding the module to meet UL and other safety requirements. This is due to the exposure or possible exposure of the aluminum foil at the cut edge. According to various embodiments, the moisture barriers described herein are ungrounded. The overlying and underlying polymers layers (e.g., PET insulation sheet and PVF weatherable back layer) together with the seal surrounding the moisture barrier electrically isolate the moisture barrier, obviating the need to ground the moisture barrier. Because the electrically isolated moisture barriers described herein do not need to be grounded, mechanical support considerations are decoupled from electrical considerations. Thus, according to various embodiments, the solar cell modules described herein included frameless as well as framed modules. In certain embodiments, the unframed modules may be configured to be attached an array frame or other support structure at an installation site.

Also provided are processes of fabricating the multi-layer back sheets described herein.

Figure 6:
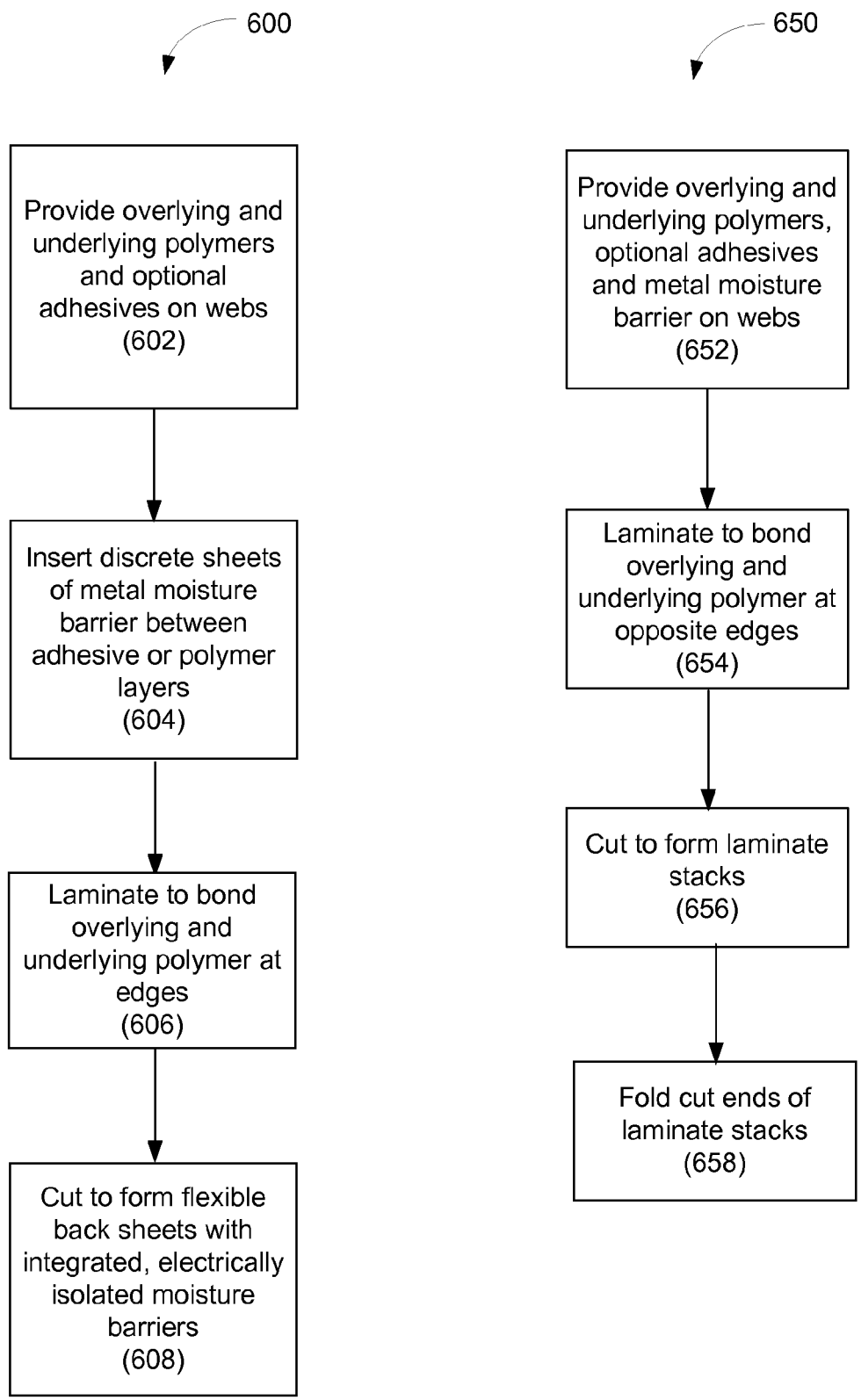
FIG. 6 depicts certain operations in roll-to-roll processes of forming multi-layer back sheets according to various embodiments.
Figure 8:
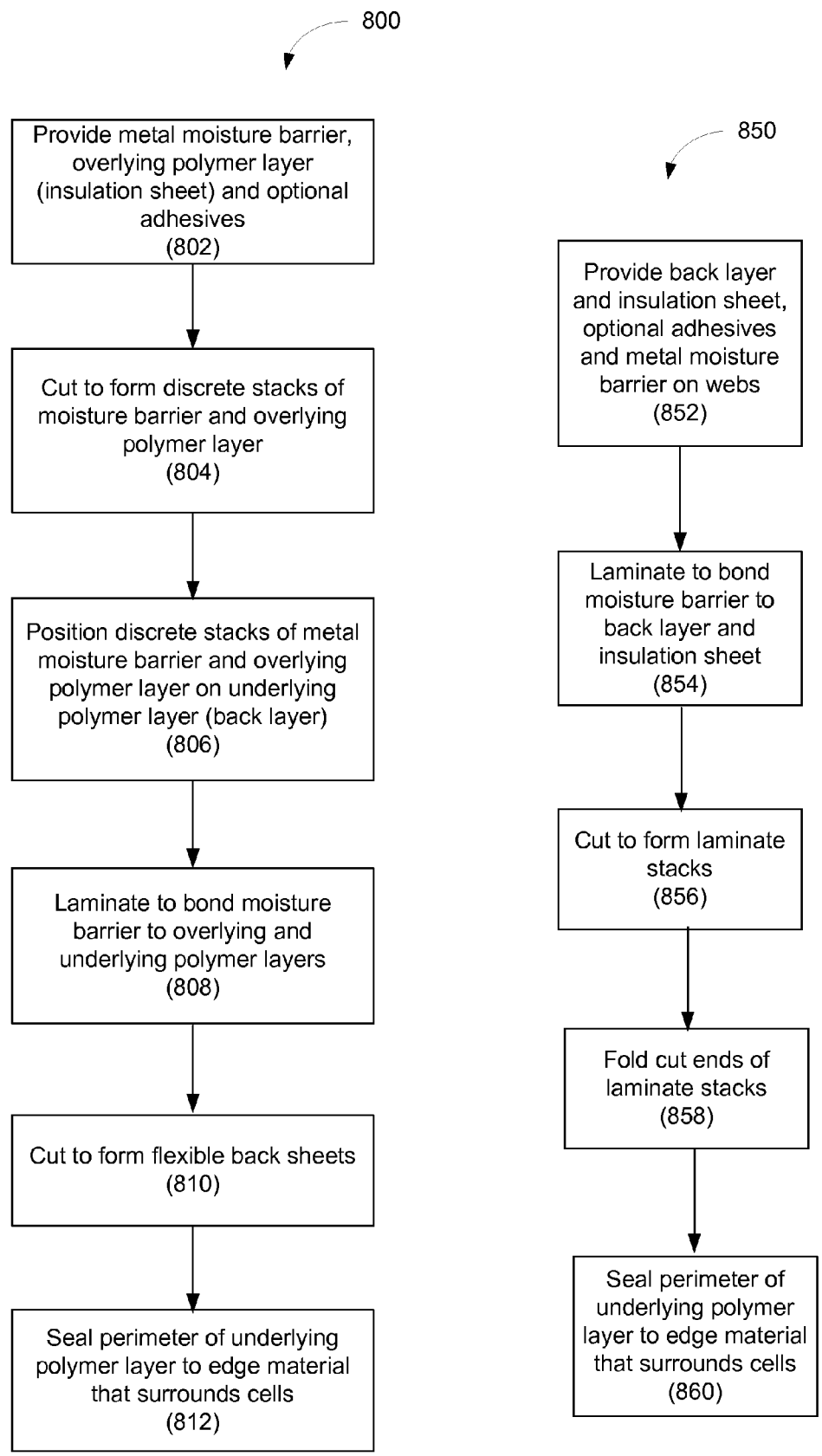
FIG. 8 depicts certain operations in roll-to-roll processes of forming multi-layer back sheets according to various embodiments

FIGS. 6-8 depicts operations in roll-to-roll processes of forming multi-layer back sheets according to various embodiments. FIGS. 6 and 7 depict operations in forming multi-layer back sheets as depicted in FIG. 3 and FIG. 8 depict operations in forming multi-layer back sheets as depicted in FIG. 4.

Turning first to FIG. 6, in process 600, discrete sheets of metal foil, typically having dimensions less than the underlying back layer and overlying insulation sheet are inserted into a pre-laminate stack including a polymeric insulation sheet and back layer material. The process begins at an operation 602, in which insulation sheet and back layer polymers and, if used, thermoplastic adhesives are provided on webs. For example, webs of PET, adhesive and PVF may be provided to assemble a PET/adhesive/adhesive/PVF pre-laminate stack. In an operation 604, discrete sheets of a metallic moisture barrier are inserted between the polymer sheets. For example, a sheet of aluminum foil is inserted between adhesive sheets to form a PET/adhesive/Al foil/adhesive/PVF pre-laminate stack assembly. The aluminum foil or other moisture barrier may be inserted before or after transverse cuts are made to form module-sized stacks. The pre-laminate stack assembly including a moisture barrier is then laminated in an operation 606, forming a seal around the entire perimeter of the moisture barrier. If still on a roll, the laminate stack may be cut as appropriate to define a module back sheet in an operation 608. The laminate stack may then be assembled with the solar cells, front layer and other module components to complete the module. One of skill in the art will understand that the order of various cutting, laminating and module assembly operations may vary. Also, another type of bonding (welding, fusing, etc.) may be performed form the seal surrounding the moisture barrier.

In process 650, rather than inserting discrete sheets, the aluminum or other moisture barrier material is also provided as a web. The process begins in an operation 652 in which the polymer insulation sheet, adhesives (is used), backing layer and moisture barrier are provided on webs to form a pre-laminate stack assembly, e.g., insulation sheet/adhesive/moisture barrier/adhesive/back layer. In certain embodiments, the width of the moisture barrier web is less than the other webs to allow for formation of a seal. The pre-laminate stack assembly is laminated in an operation 654. The laminate stack is cut in an operation 656 to form module-sized laminate stacks. In certain embodiments, the resulting module-sized stack includes a moisture barrier material extending to the cut edges. This is depicted in FIG. 7, which shows a top view of laminate stack 702, including moisture barrier 704, uncut edges 708a and 708b, cut edges 710a and 710b, and a seal 706 along opposing uncut edges 708a and 708b of the laminate stack. Seal 706 includes bonded-together insulation sheet and backing layer polymeric layers. The moisture barrier 704 and the overlying and underlying polymer layers are coextensive along the length of module-sized stack (direction "Y" in the figure). A side view of a cut edge 711 is shown, with polymer layers 712 and 714 and moisture barrier 704. (Adhesive layers are not depicted for the sake of illustration.). Returning to FIG. 6, to electrically isolate the moisture barrier, the cut edges are folded in an operation 658. An example of such as fold is depicted at 716 in FIG. 7, with polymer layers 712 and 714 and moisture barrier 704 curved inward together, such that the edge of moisture barrier 704 is fully isolated by one or more of layers 712 and 714. An additional sealing operation may then be performed, e.g., by applying heat, pressure and or adhesive to the fold. The fold may include one or more inward curved portions, including bent or angled portions. In the example shown in FIG. 7, the edge is folded twice to form two inward curved portions, fully isolating the edge of the moisture barrier along the cut sides. The fold may be considered part of the seal that extends around the solar module.

FIG. 8 depicts operations in roll-to-roll processes of forming a multi-layer back sheet such as that depicted in FIG. 4. In process 800, the insulation sheet and metal foil are cut together, to form discrete insulation sheet/metal barrier stacks that sized and positioned on the back layer material such that the perimeter of the back layer extends around the metal barrier and insulation sheet. The process begins at an operation 802, in which insulation sheet and moisture barrier materials are provided. If used, thermoplastic or other adhesives may also be provided. The materials may be provided on webs or in other appropriate form. In an operation 804, the overlying polymer and moisture barrier material are cut to form discrete stacks of insulation sheet and moisture barrier material in their desired size. In embodiments in which the insulation sheet and moisture barrier are of approximately the same size, the insulation sheet and moisture barrier may be cut simultaneously. Also, in certain embodiments, the insulation sheet material and moisture barrier material may be received already appropriately sized without needing to be cut. Once an appropriately-sized insulation sheet and moisture barrier stack is formed, it is then positioned on back layer material in an operation 806. Adhesive layers may also be part of the stack or otherwise appropriately placed. The back layer material may be provided on a web. A lamination operation may be performed to bond the layers together in an operation 808. If still on a roll, the back layer may be cut as appropriate to define a module back sheet in an operation 810. At this point, the insulation sheet covers one surface of the moisture barrier with the back layer covering the opposite surface of the moisture barrier. The perimeter of the back layer may be bent or otherwise extended upward to cover the edge of moisture barrier, or this may occur during further processing when the back sheet is assembled with the rest of the module components. For example, the back layer/moisture barrier/insulation sheet stack may then be assembled with the solar cells, front layer and other module components to complete the module. In doing so, the perimeter of the back layer may be sealed in an operation 812 to another module component, such as the edge seal material that surrounds the solar cells. One of skill in the art will understand that the order of various cutting, laminating and module assembly operations may vary.

In a process 850, rather than positioning discrete stacks of insulation sheet and moisture barrier material on the back layer, the flexible back sheets may be assembled using a roll-to-roll process. The process begins in an operation 852 in which the polymer insulation sheet, adhesives (is used), backing layer and moisture barrier are provided on webs to form a pre-laminate stack assembly, e.g., insulation sheet/adhesive/moisture barrier/adhesive/back layer. In certain embodiments, the width of the back layer web is greater than the insulation sheet and moisture barrier webs to allow the perimeter of the back layer to cover the edges of those layers. The pre-laminate stack assembly is laminated in an operation 854. The laminate stack is cut in an operation 856 to form module-sized laminate stacks. In this case, the laminate stacks may look like the laminate stack shown at view 702 in FIG. 7, with 706 representing the width of the back layer material that extends past the insulation sheet and moisture barrier on the uncut edges. As depicted at view 711 in FIG. 7, the resulting module-sized stack includes a moisture barrier material extending to the cut edges. To electrically isolate the moisture barrier, the cut edges are folded in an operation 858, as depicted at 716 in FIG. 7. The unfolded edges of the back layer may then be sealed to another module component as described above in an operation 860. In certain embodiments, the folded edges may be similarly sealed.

Other Embodiments

According to various embodiments, the flexible back sheet may include one or more additional layers. For example, in certain embodiments, additional layers may be between the moisture barrier layer and a weatherable material and/or between the moisture barrier layer and an insulation layer. The seal may include a bond between any of the layers, so long as a layer overlying the moisture barrier is bonded to an underlying barrier such to prevent any electrical connection to the edge of the moisture barrier.

While the description above refers chiefly to metallic moisture barriers, other types of flexible moisture barriers are within the scope of the invention, including moisture barriers made of non-metallic conductive materials, semiconductor materials, etc. As described above, in certain embodiments, the back sheets and methods described herein find particular application with conductive moisture barriers.

In addition to the specific examples of polymeric materials that may be used for the insulation sheet, back layer, adhesives, etc., examples of materials that may be used as appropriate for one of these layers or for other layers in the module include, silicone, silicone gel, epoxy, RTV silicone rubber, polydimethyl siloxane (PDMS), polyvinyl butyral (PVB), polycarbonates, acrylics, urethanes including thermoplastic polyurethanes (TPU), poly(vinyl acetal), polyolefin block elastomers, ethylene acrylate ester copolymers, acid copolymers, silicone elastomers, epoxy resins, polyolefin block elastomers, ethylene acrylate ester copolymers, rubber, thermoplastic elastomers, other materials with similar material properties, and mixtures thereof.

Although the foregoing invention has been described in some detail for purposes of clarity of understanding, it will be apparent that certain changes and modifications may be practiced within the scope of the invention. It should be noted that there are many alternative ways of implementing both the processes and apparatuses of the present invention. Accordingly, the present embodiments are to be considered as illustrative and not restrictive, and the invention is not to be limited to the details given herein.

What is claimed is:

1. A photovoltaic module comprising:
 a transparent front layer;
 a multi-layer flexible back sheet;
 a plurality of interconnected photovoltaic cells disposed between the transparent front layer and the multi-layer flexible back sheet; and
 an edge seal material surrounding the plurality of photovoltaic cells and disposed between the transparent front layer and the multi-layer flexible back sheet,
 wherein said multi-layer flexible back sheet comprises an insulation sheet, an electrically isolated moisture barrier and a back layer; said insulation sheet disposed between the plurality of photovoltaic cells and the moisture barrier, said moisture barrier disposed between the insulation sheet and the back layer, wherein said back layer has dimensions greater than the moisture barrier and extends past the moisture barrier to enclose an edge of the moisture barrier, further wherein said back layer extends past the insulation sheet to enclose an edge of the insulation sheet, and further wherein said edge seal material is sealed to the back layer.

2. The photovoltaic module of claim 1, wherein said insulation sheet and said back layer are arranged to fully enclose said moisture barrier.

3. The photovoltaic module of claim 1 wherein the moisture barrier comprises a thin metal sheet.

4. The photovoltaic module of claim 1 wherein the moisture barrier comprises a pinhole free aluminum foil sheet.

5. The photovoltaic module of claim 1 wherein moisture barrier has thickness of no more than about 50 microns.

6. The photovoltaic module of claim 1 wherein the moisture barrier has a thickness of no more than about 25 microns.

7. The photovoltaic module of claim 1 wherein the insulation sheet withstands at least a 600 V potential.

8. The photovoltaic module of claim 1 wherein the insulation sheet withstands at least a 1000 V potential.

9. The photovoltaic module of claim 1 wherein the insulation sheet is selected from at least one of the group consisting of polyethylene terephthalate (PET), nylons, acylonitrile butadiene styrene (ABS), polybutylene terephthalate (PBT), polycarbonate (PC), polyphenylene sulfide (PPS), and polyphenylene oxide (PPO).

10. The photovoltaic module of claim 1 wherein the back layer comprises a fluorinated polymer.

11. The photovoltaic module of claim 1 wherein the wherein the multi-layer flexible back sheet is ungrounded and has a water vapor transmission rate (WVTR) of no more than about $10^{-2}$ g/m$^2$/day.

12. The photovoltaic module of claim 1 wherein the wherein the multi-layer flexible back sheet is ungrounded and has a water vapor transmission rate (WVTR) of no more than about $10^{-3}$ g/m$^2$/day.

* * * * *